United States Patent
Bahr et al.

(10) Patent No.: US 11,126,144 B2
(45) Date of Patent: *Sep. 21, 2021

(54) MILLIMETER WAVE CHIP SCALE ATOMIC CLOCK

(71) Applicant: TEXAS INSTRUMENTS INCORPORATED, Dallas, TX (US)

(72) Inventors: Bichoy Bahr, Richardson, TX (US); Argyrios Dellis, Dallas, TX (US); Juan Alejandro Herbsommer, Allen, TX (US); Baher Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/844,819

(22) Filed: Apr. 9, 2020

(65) Prior Publication Data
US 2020/0241480 A1 Jul. 30, 2020

Related U.S. Application Data

(63) Continuation of application No. 16/232,426, filed on Dec. 26, 2018, now Pat. No. 10,620,589.

(51) Int. Cl.
| | |
|---|---|
| *H03B 17/00* | (2006.01) |
| *G04F 5/14* | (2006.01) |
| *H03L 7/26* | (2006.01) |
| *G06F 1/08* | (2006.01) |
| *H03L 7/099* | (2006.01) |

(52) U.S. Cl.
CPC .............. *G04F 5/14* (2013.01); *G06F 1/08* (2013.01); *H03B 17/00* (2013.01); *H03L 7/0991* (2013.01); *H03L 7/26* (2013.01)

(58) Field of Classification Search
CPC ... G04F 5/14; G04F 5/145; G06F 1/08; H03B 17/00; H03L 7/26
USPC ...................................................... 331/3, 94.1
See application file for complete search history.

(56) References Cited

U.S. PATENT DOCUMENTS

| | | |
|---|---|---|
| 2,811,644 A | 1/1955 | Norton |
| 4,449,105 A | 5/1984 | Frank et al. |
| 2019/0235445 A1 | 8/2019 | Han et al. |

*Primary Examiner* — Levi Gannon
(74) *Attorney, Agent, or Firm* — Valerie M. Davis; Charles A. Brill; Frank D. Cimino

(57) ABSTRACT

A clock generator includes a hermetically sealed cavity and clock generation circuitry. A dipolar molecule that exhibits a quantum rotational state transition at a fixed frequency is disposed in the cavity. The clock generation circuitry is configured to generate an output clock signal based on the fixed frequency of the dipolar molecule. The clock generation circuitry includes a detector circuit, a multiplier, and reference oscillator control circuitry. The detector circuit is coupled to the cavity, and is configured to generate a detection signal representative of an amplitude of a signal at an output of the cavity. The multiplier is coupled to the detector circuit, and is configured to multiply the detection signal with a mixing signal to produce a derivative of the detection signal. The reference oscillator control circuitry is configured to set a frequency of a reference oscillator based on the derivative of the detection signal.

30 Claims, 8 Drawing Sheets

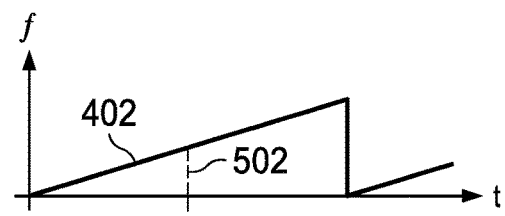
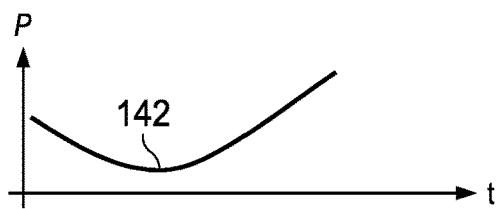
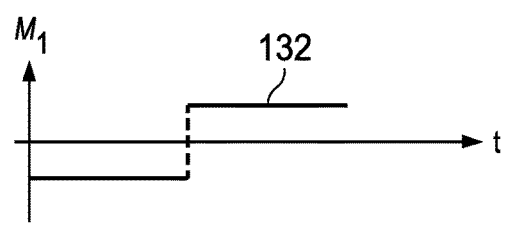
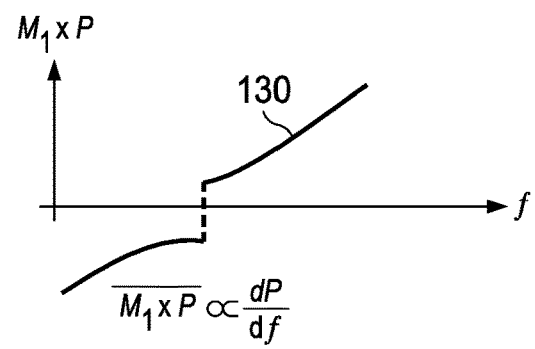
FIG. 5
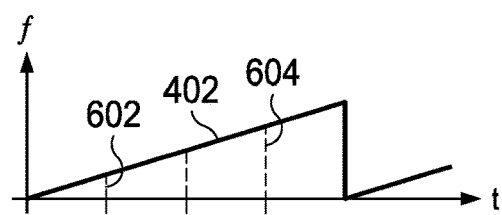
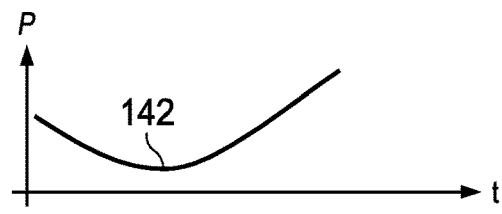
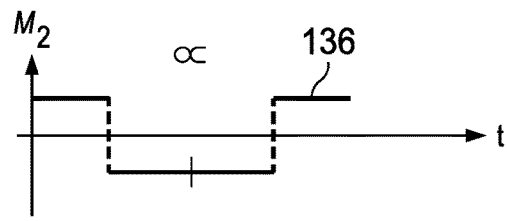
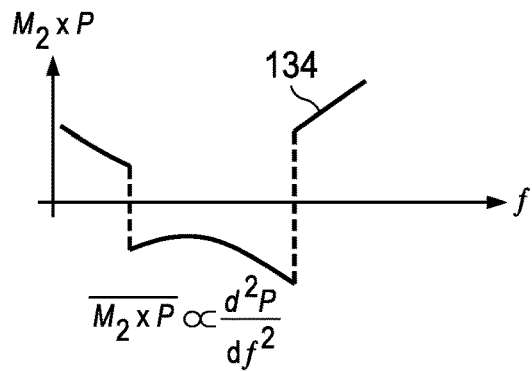
FIG. 6

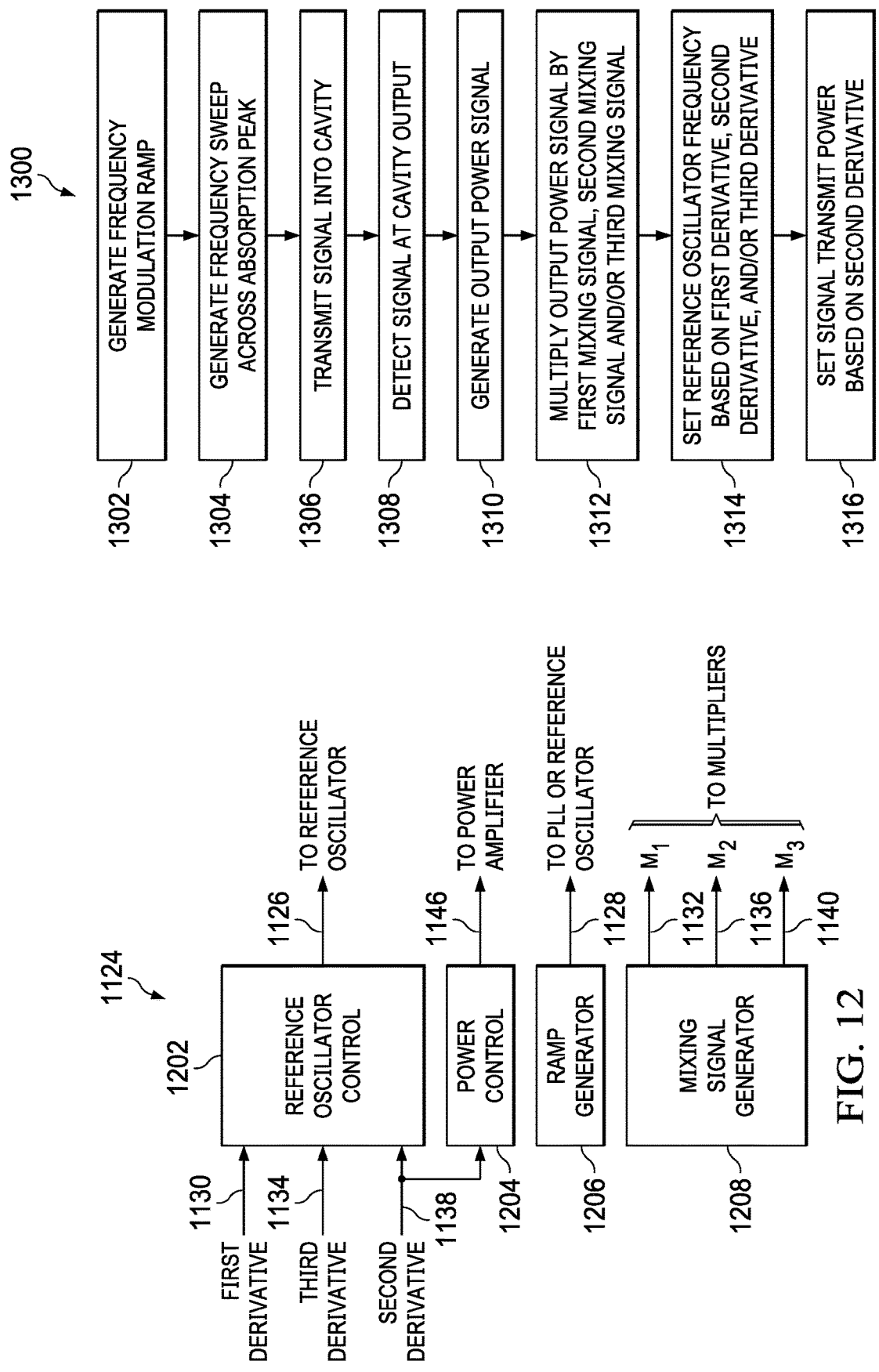

MILLIMETER WAVE CHIP SCALE ATOMIC CLOCK

CROSS-REFERENCE TO RELATED APPLICATION

This application is a continuation of U.S. patent application Ser. No. 16/232,426 filed Dec. 26, 2018, the entirety of which is incorporated herein by reference.

BACKGROUND

An atomic clock is an oscillator that provides a highly stable frequency over a long period of time because its resonance frequency is determined by the energy transition of atoms. In contrast, the frequency of a crystal oscillator is determined by the length of the crystal and is therefore much more susceptible to temperature variations than an atomic clock.

Atomic clocks are utilized in various systems that require extremely accurate and stable frequencies, such as in bistatic radars, GPS (global positioning system) and other navigation and positioning systems, as well as in various communications systems (e.g., cellular telephone systems).

In one type of atomic clock, a cell containing an active medium such as cesium (or rubidium) vapor. An optical pumping device, such as a laser diode transmits a light beam of a particular wavelength through the vapor, which is excited to a higher state. Absorption of the light in pumping the atoms of the vapor to the higher state is sensed by a photodetector which provides an output signal proportional to the light beam impinging on the detector.

By examining the output of the photodetector, a control system provides various control signals to ensure that the wavelength of the propagated light is precisely controlled.

SUMMARY

In one example, a clock generator includes a hermetically sealed cavity, a dipolar molecule, and clock generation circuitry. The dipolar molecule is in the hermetically sealed cavity. The dipolar molecule has a quantum rotational state transition at a fixed frequency. The clock generation circuitry is configured to generate an output clock signal based on the fixed frequency of the dipolar molecule. The clock generation circuitry includes a reference oscillator, a detector circuit, a multiplier, and reference oscillator control circuitry. The reference oscillator is configured to generate an oscillator signal based on the fixed frequency of the dipolar molecule. The detector circuit is coupled to the hermetically sealed cavity. The detector circuit is configured to generate a detection signal representative of an amplitude of a signal at an output of the hermetically sealed cavity. The multiplier is coupled to the detector circuit. The multiplier is configured to multiply the detection signal with a mixing signal to produce a derivative of the detection signal. The reference oscillator control circuitry is configured to set a frequency of the reference oscillator based on the derivative of the detection signal.

In another example, a method for clock generation includes transmitting a millimeter wave signal into a hermetically sealed cavity. The hermetically sealed cavity contains a dipolar molecule that exhibits a quantum rotational state transition at a fixed frequency. The millimeter wave signal is generated by continuously modulating the frequency of a drive signal about the fixed frequency. An output of the hermetically sealed cavity is detected and a power signal representative of an amplitude of the output of the hermetically sealed cavity is generated. The power signal is multiplied with a mixing signal to produce a derivative of the power signal. A frequency of the reference oscillator is set based on the derivative of the power signal.

In a further example, a clock generator includes a hermetically sealed cavity, a dipolar molecule, and clock generation circuitry. The dipolar molecule is in the hermetically sealed cavity. The dipolar molecule has a quantum rotational state transition at a fixed frequency. The clock generation circuitry is configured to generate an output clock signal based on the fixed frequency of the dipolar molecule. The clock generation circuitry includes a reference oscillator, a phase-locked-loop (PLL), a detector circuit, a multiplier, and reference oscillator control circuitry. The reference oscillator is configured to generate an oscillator signal based on the fixed frequency of the dipolar molecule. The PLL is coupled to the reference oscillator and to the hermetically sealed cavity. The PLL is configured to generate a drive signal to be transmitted via the hermetically sealed cavity. The frequency of the drive signal is continuously modulated. The detector circuit is coupled to the hermetically sealed cavity. The detector circuit is configured to generate a power signal representative of an amplitude of a signal at an output of the hermetically sealed cavity. The multiplier is coupled to the detector circuit. The multiplier is configured to multiply the power signal with a mixing signal to produce a derivative of the detection signal. The reference oscillator control circuitry is configured to set a frequency of the reference oscillator based on the derivative of the detection signal.

BRIEF DESCRIPTION OF THE DRAWINGS

FIG. 5 shows an example of first derivative generation in accordance with this description.

FIG. 6 shows an example of second derivative generation in accordance with this description.

FIG. 12 shows a block diagram for an example of for an example of digital control circuitry of an mmwCSAC in accordance with this description.

FIG. 13 shows a flow diagram for an example of a method for generating a clock signal in an mmwCSAC in accordance with this description.

DETAILED DESCRIPTION OF EXAMPLE EMBODIMENTS

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on."

In a millimeter wave chip scale atomic clock (mmwCSAC), a dipolar molecule is used to set the frequency of a clock signal. The dipolar molecule has quantum rotational states that can be measured through electromagnetic wave absorption. A peak value of electromagnetic wave absorption that occurs at a fixed and known frequency is monitored and applied to control the frequency of the clock signal. In some implementations, frequency shift keying (FSK) is used identify the absorption peak by balancing the amplitude of two FSK tones on either side of the absorption peak. However, changes in characteristics of the cavity containing the dipolar molecule caused by variations in temperature or other environmental conditions can interfere with detection of the absorption peak when only two tones are used. As a result, the clock signal may be locked to a wrong frequency.

Implementations of the mmwCSAC disclosed herein include clock generation circuitry that avoids the false locking that can occur with FSK. The clock generation circuitry of this description employs frequency modulated continuous wave (FMCW) excitation, rather than FSK, to identify the absorption peak. The clock generation circuitry mixes the amplitude of a signal exiting the cavity containing the dipolar molecule at frequencies about the absorption peak with a number of selected waveforms to produce derivatives (i.e., differential coefficients) of the amplitude (e.g., power) signal. The clock generation circuitry applies the derivatives to set the frequency of the clock signal, to avoid locking to the wrong frequency, and to stabilize the amplitude of the FMCW signal used to interrogate the dipolar molecule. The first derivative can be used to lock the frequency of the clock signal to the absorption peak. The second derivative can be used to avoid false locking and to stabilize to power of the FMCW signal. The third derivative can also be used to lock the frequency of the clock signal to the absorption peak.

Figure 1:
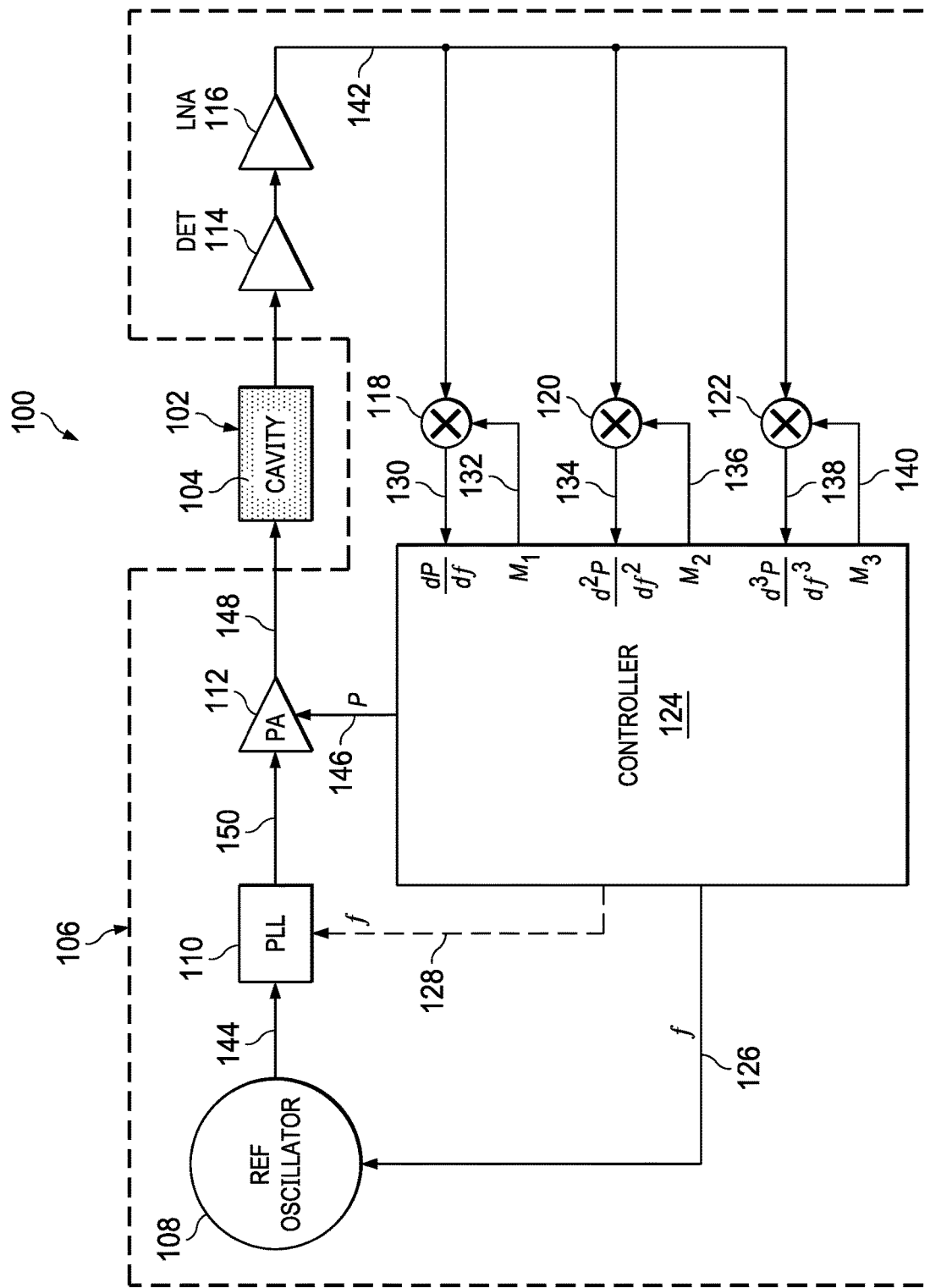
FIG. 1 shows a block diagram for an example of a millimeter wave chip scale atomic clock (mmwCSAC) in accordance with this description.

FIG. 1 shows a block diagram for an example of an mmwCSAC 100 in accordance with this description. The mmwCSAC 100 includes a cavity 102 that contains a dipolar molecule 104, and includes clock generation circuitry 106 that interrogates the dipolar molecule 104. The cavity 102 is hermitically sealed. In some implementations, the dipolar molecule 104 may be a water molecule. The cavity 102 operates as a waveguide to direct electromagnetic signal from a cavity input port to a cavity output port. The cavity 102 may be constructed via a microelectromechanical system (MEMS) fabrication process in a silicon substrate, a ceramic substrate, or other suitable substrate.

The clock generation circuitry 106 includes circuitry that drives electromagnetic signal into the cavity 102, receives electromagnetic signal from the cavity 102, and generates an oscillator signal locked to an absorption peak of the dipolar molecule 104 disposed in the cavity 102. More specifically, the clock generation circuitry 106 includes a reference oscillator 108, a phase-locked-loop (PLL) 110, a power amplifier 112, a detector circuit 114, a low-noise amplifier (LNA) 116, a multiplier 118, a multiplier 120, a multiplier 122, and a controller 124. The reference oscillator 108 is an oscillator that is adjustable via the control signal 126. For example, the reference oscillator 108 may be a crystal oscillator having an output frequency that can be varied over a narrow range by changing the control signal 126. In various implementations, the reference oscillator 108 is a voltage-controlled crystal oscillator (VCXO) or a voltage-controlled oscillator (VCO). The output 144 of the reference oscillator 108 is provided to the PLL 110. The output 144 of the reference oscillator 108 may also be provided to a driver circuit (not shown) for provision to circuits external to the mmwCSAC 100.

The PLL 110 is coupled to the reference oscillator 108, and includes circuits to multiply the frequency of the output 144 up to a range that includes the frequency of the selected absorption peak of the dipolar molecule 104. The PLL 110 may include a phase detector, a filter, counters, and other circuitry for PLL frequency multiplication. The output frequency of the PLL 110 can also be varied by a control signal 128. For example, the output frequency of the PLL 110 may be centered at a fixed multiple of the frequency of the output 144 and varied over a range that includes frequencies below and above the center frequency by changing the control signal 128. In this way, the PLL 110 may generate a frequency sweep about the absorption peak of the dipolar molecule 104. The output 150 of the PLL 110 is provided to the power amplifier 112.

The power amplifier 112 is coupled to the PLL 110 and the cavity 102, and includes circuitry for amplifying the output 150 of the PLL 110 and driving the cavity 102. The power amplifier 112 may include circuitry for applying voltage gain and/or current gain to the output 150 of the PLL 110. The output power of the power amplifier 112 is variable via the control signal 146.

The cavity 102 includes an input port and an output port. The electromagnetic signal generated by the power amplifier 112 propagates through the cavity 102 from the input port to the output port. The dipolar molecule 104 has an absorption peak at a frequency of quantum rotational state transition that reduces the amplitude of the electromagnetic signal at the output port at the absorption peak. The detector circuit 114 is coupled to the output port of the cavity 102.

Figure 2:
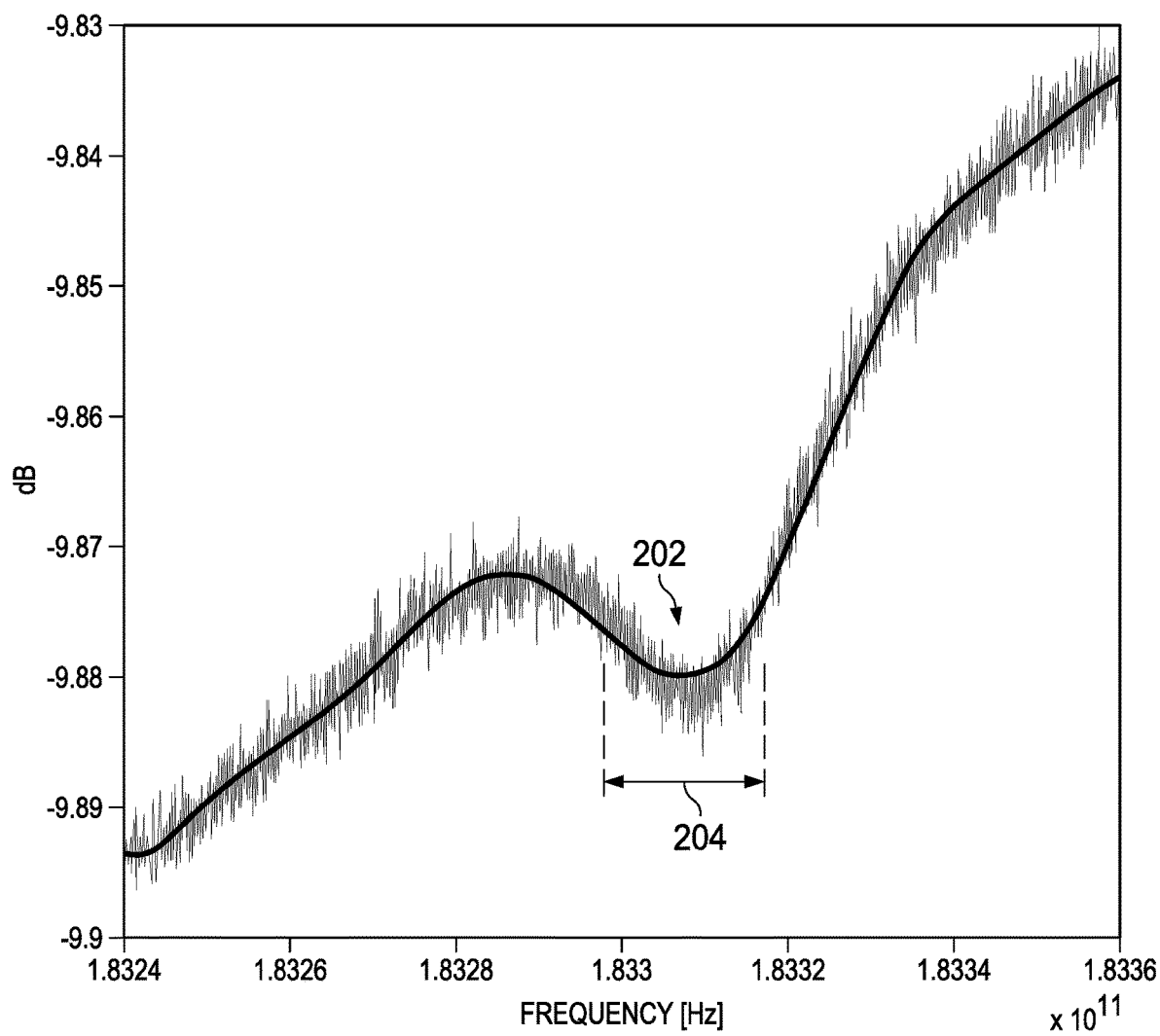
FIG. 2 show an example of an absorption peak in a mmwCSAC in accordance with this description.

The detector circuit 114 includes circuitry that monitors the amplitude of the electromagnetic signal at frequencies about the absorption peak. For example, an implementation of the detector circuit 114 includes a mixer that multiplies the signal output from the cavity 102 and the output 150 of the PLL 110, and a low-pass filter that generates a signal from the output of the mixer, where the signal is representative of the amplitude of the signal received from the cavity 102 at the frequency generated by the PLL 110. The output of the detector circuit 114 is provided to the LNA 116. FIG. 2 show an example of an absorption peak 202 in the mmwCSAC 100 and the power signal generated by the detector circuit 114. An example of the range of frequencies swept by the PLL 110 is illustrated as frequency range 204. The absorption peak of the dipolar molecule 104, which is water in this example, is at 183.31 gigahertz (GHz). The LNA 116 amplifies the signal received from the detector circuit 114, and provides the amplified LNA output signal 142 to the multiplier 118, the multiplier 120, and the multiplier 122. The multiplier 118 multiples the amplified LNA output signal 142 by a mixer signal 132. The average of the product of the amplified LNA output signal 142 and the mixer signal 132 is the first derivative 130 of the amplified LNA output signal 142. The multiplier 120 multiples the amplified LNA output signal 142 by a mixer signal 136. The average of the product of the amplified LNA output signal 142 and the mixer signal 136 is the second derivative 134 of the amplified LNA output signal 142. The multiplier 122 multiples the amplified LNA output signal 142 by a mixer signal 140. The average of the product of the amplified LNA output signal 142 and the mixer signal 140 is the third derivative 138 of the amplified LNA output signal 142.

The multiplier 118, the multiplier 120, and the multiplier 122 are coupled to the controller 124. In some implementations of the mmwCSAC 100, the multiplier 118, the multiplier 120, and the multiplier 122 are included in the controller 124. The controller 124 provides the mixer signal 132, the mixer signal 136, and the mixer signal 140 to the multiplier 118, the multiplier 120, and the multiplier 122 respectively. The controller 124 receives the first derivative 130 generated by the multiplier 118, the second derivative 134 generated by the multiplier 120, and the third derivative 138 generated by the multiplier 122. The controller 124 applies the first derivative 130, the second derivative 134, and the third derivative 138 to control the reference oscillator 108, the PLL 110, and the power amplifier 112.

Figure 3:
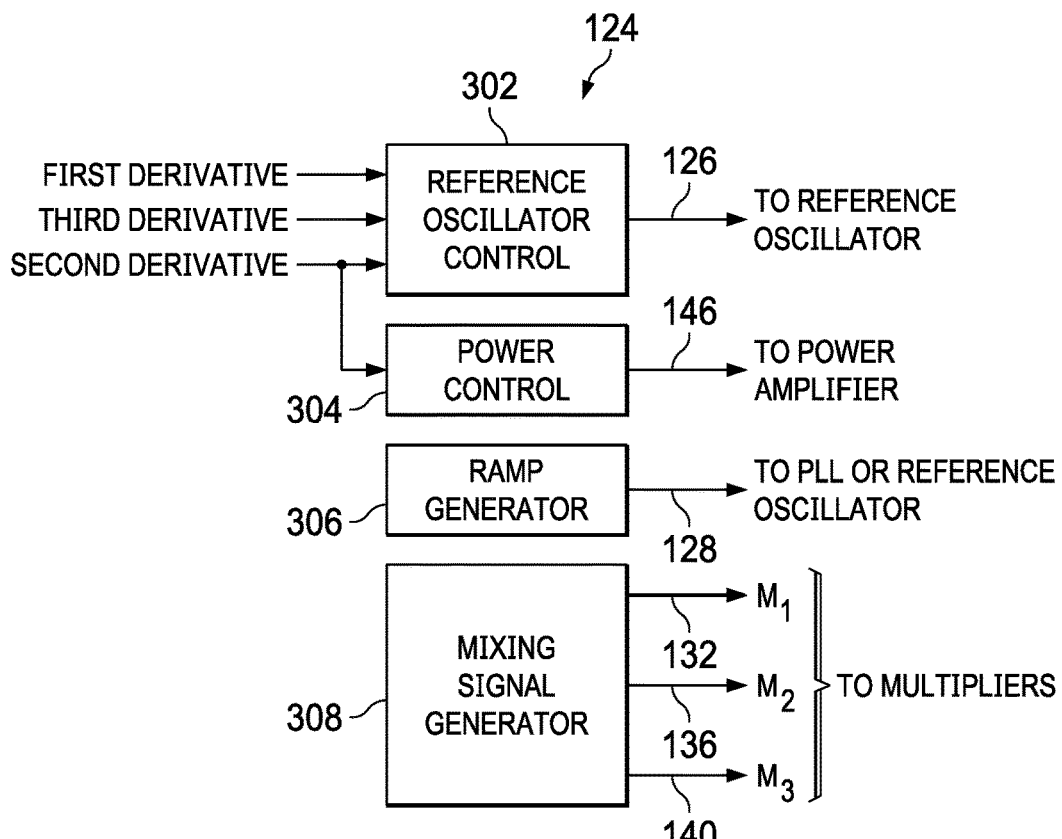
FIG. 3 shows a block diagram for an example of control circuitry of a mmwCSAC in accordance with this description.
Figure 4:
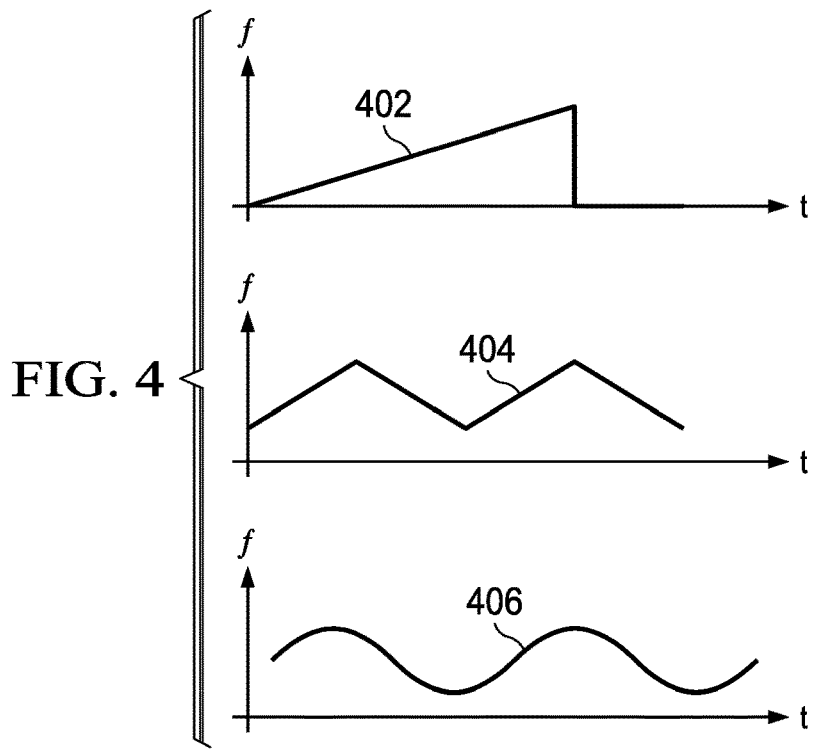
FIG. 4 shows an example of a sawtooth ramp, a triangular ramp, and a sinusoidal ramp used to modulate an interrogation signal in a mmwCSAC in accordance with this description.

FIG. 3 shows a block diagram for an example of the controller 124 of the mmwCSAC 100. The controller 124 includes reference oscillator control circuitry 302, power control circuitry 304, ramp generator circuitry 306, and mixing signal generation circuitry 308. The ramp generator circuitry 306 generates the control signal 128 that modulates the output 150 generated by the PLL 110. The control signal 128 may include a sawtooth ramp, a triangular ramp, or a sinusoidal ramp. FIG. 4 shows an example of a sawtooth ramp 402, a triangular ramp 404, and a sinusoidal ramp 406 generated by the ramp generator circuitry 306. The ramp generator circuitry 306 may include a memory that stores values of the sawtooth ramp 402, the triangular ramp 404, and/or the sinusoidal ramp 406 and circuitry that reads the values from memory to generate the control signal 128.

The mixing signal generation circuitry 308 generates the mixer signal 132, the mixer signal 136, and the mixer signal 140. The mixing signal generation circuitry 308 may generate the mixer signal 132, the mixer signal 136, and mixer signal 140 based on the control signal 128. FIG. 5 shows an example of the mixer signal 132 and associated signals. In FIG. 5, the sawtooth ramp 402 is provided as the control signal 128 to the PLL 110. The amplified LNA output signal 142, which is produced as a result of the output 150, is provided to the multiplier 118. The mixing signal generation circuitry 308 generates the mixer signal 132 based on the sawtooth ramp 402. For example, the mixing signal generation circuitry 308 may transition the mixer signal 132 from negative to positive at the timewise center 502 of the sawtooth ramp 402. The multiplier 118 multiplies the amplified LNA output signal 142 and the mixer signal 132 to produce the first derivative 130. The average of the first derivative 130 is proportional to the first derivative of the amplified LNA output signal 142.

$$\overline{M_1 P} \propto \frac{dP}{df}$$

FIG. 6 shows an example of the mixer signal 136 and associated signals. In FIG. 6, the sawtooth ramp 402 is provided as the control signal 128 to the PLL 110. The amplified LNA output signal 142, which is produced as a result of the output 150, is provided to the multiplier 120. The mixing signal generation circuitry 308 generates the mixer signal 136 based on the sawtooth ramp 402. For example, the mixing signal generation circuitry 308 may transition the mixer signal 136 from positive to negative at the timewise one-quarter point 602 of the sawtooth ramp 402 and transition the mixer signal 136 from negative to positive at the timewise three-quarter point 604 of the sawtooth ramp 402. The multiplier 120 multiplies the amplified LNA output signal 142 and the mixer signal 136 to produce the second derivative 134. The average of the second derivative 134 is proportional to the second derivative of the amplified LNA output signal 142.

$$\overline{M_2 P} \propto \frac{d^2 P}{df^2}$$

Figure 7:
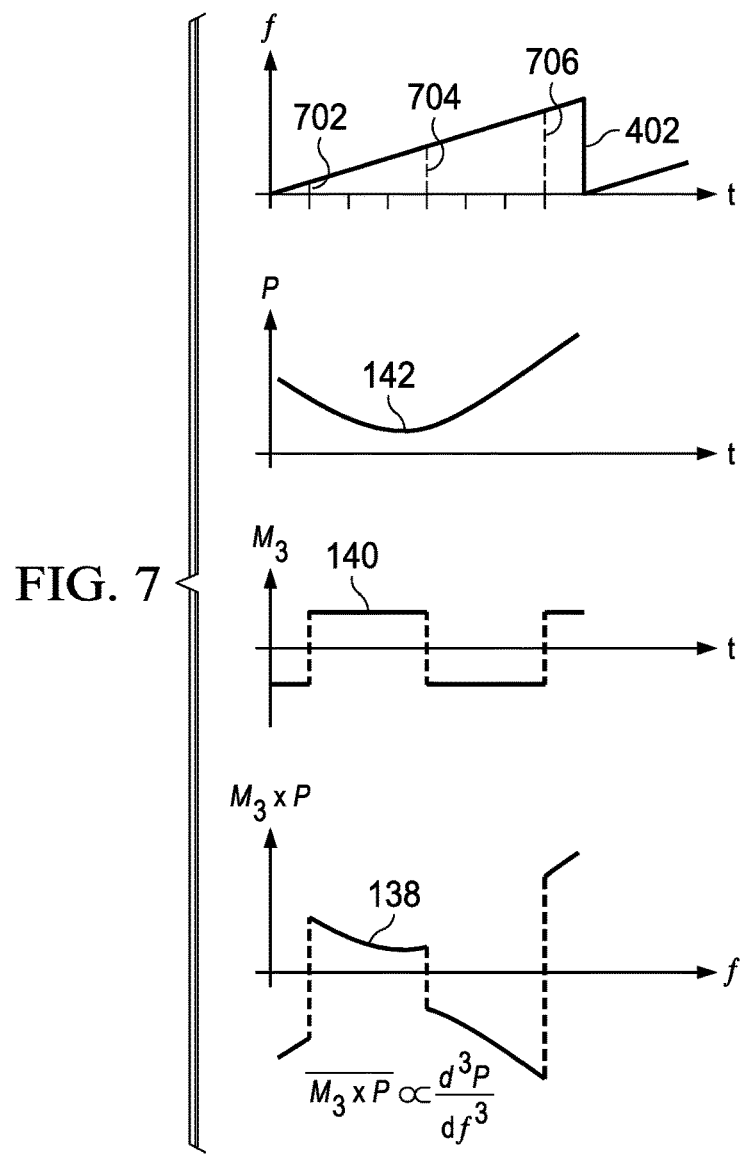
FIG. 7 shows an example of third derivative generation in accordance with this description.

FIG. 7 shows an example of the mixer signal 140 and associated signals. In FIG. 7, the sawtooth ramp 402 is provided as the control signal 128 to the PLL 110. The amplified LNA output signal 142, which is produced as a result of the output 150, is provided to the multiplier 122. The mixing signal generation circuitry 308 generates the mixer signal 140 based on the sawtooth ramp 402. For example, the mixing signal generation circuitry 308 may transition the mixer signal 140 from negative to positive at the timewise one-eighth point 702 of the sawtooth ramp 402, transition the mixer signal 140 from positive to negative at the timewise one-half point 604 of the sawtooth ramp 402, and transition the mixer signal 140 from negative to positive at the timewise seven-eighth point 706 of the sawtooth ramp 402. The multiplier 122 multiplies the amplified LNA output signal 142 and the mixer signal 140 to produce the third derivative 138. The average of the third derivative 138 is proportional to the third derivative of the amplified LNA output signal 142.

$$\overline{M_3 P} \propto \frac{d^3 P}{df^3}$$

Figure 8:
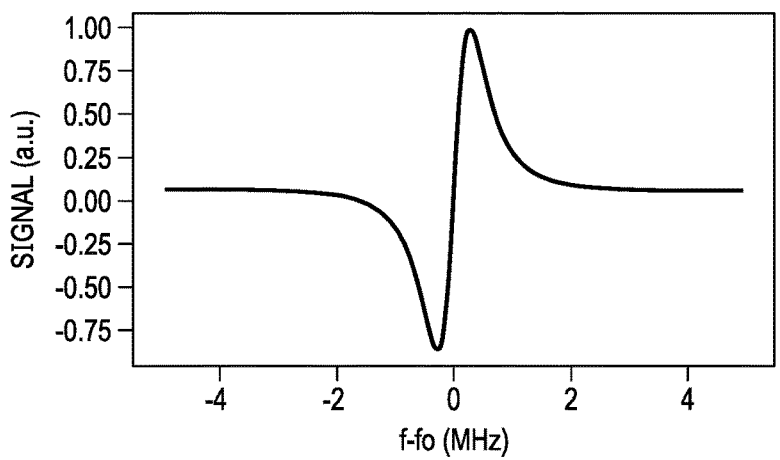
FIG. 8 shows an example of a first derivative of an amplitude signal generated for an absorption peak in accordance with this description.

The reference oscillator control circuitry 302 and the power control circuitry 304 apply the first derivative 130, the second derivative 134, and/or the third derivative 138 to generate the control signal 126 for controlling the reference oscillator 108 and to generate the control signal 146 for controlling the power amplifier 112. Implementations of the reference oscillator control circuitry 302 include circuitry to adjust the frequency of the reference oscillator 108 based on the first derivative 130, the second derivative 134, and/or the third derivative 138. FIG. 8 shows an example of a first derivative of the amplified LNA output signal 142. The first derivative crosses the frequency axis at a minima of the absorption peak represented by the amplified LNA output signal 142. Some implementations of the reference oscillator control circuitry 302 adjust the frequency of the reference oscillator 108 so that the output 144 is at the frequency where the first derivative crosses the frequency axis.

Figure 9:
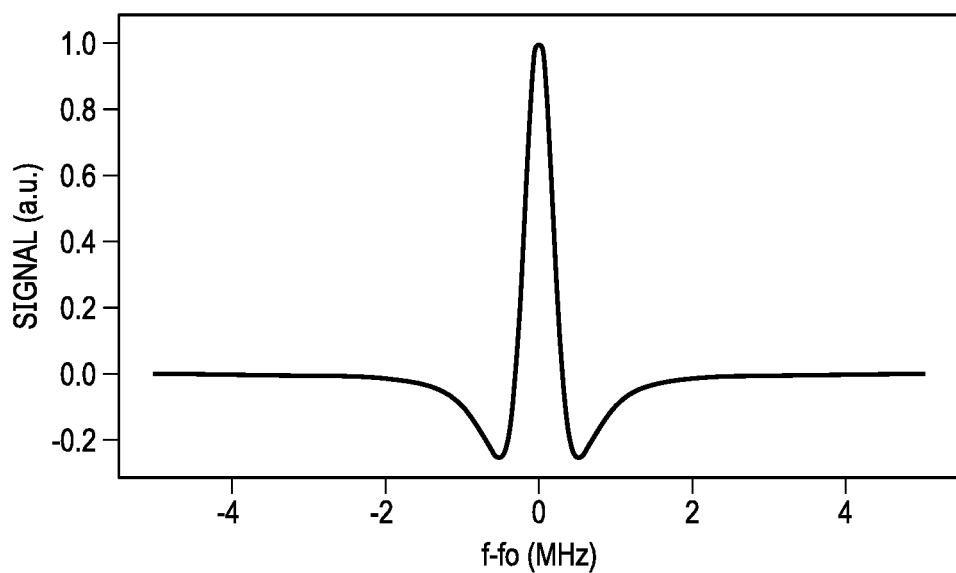
FIG. 9 shows an example of a second derivative of an amplitude signal generated for an absorption peak in accordance with this description.

FIG. 9 shows an example of a second derivative of the amplified LNA output signal 142. The peak of the second derivative occurs at a minima of the absorption peak represented by the amplified LNA output signal 142. Some implementations of the reference oscillator control circuitry 302 adjust the frequency of the reference oscillator 108 so that the output 144 is at the peak frequency of the second derivative.

Figure 10:
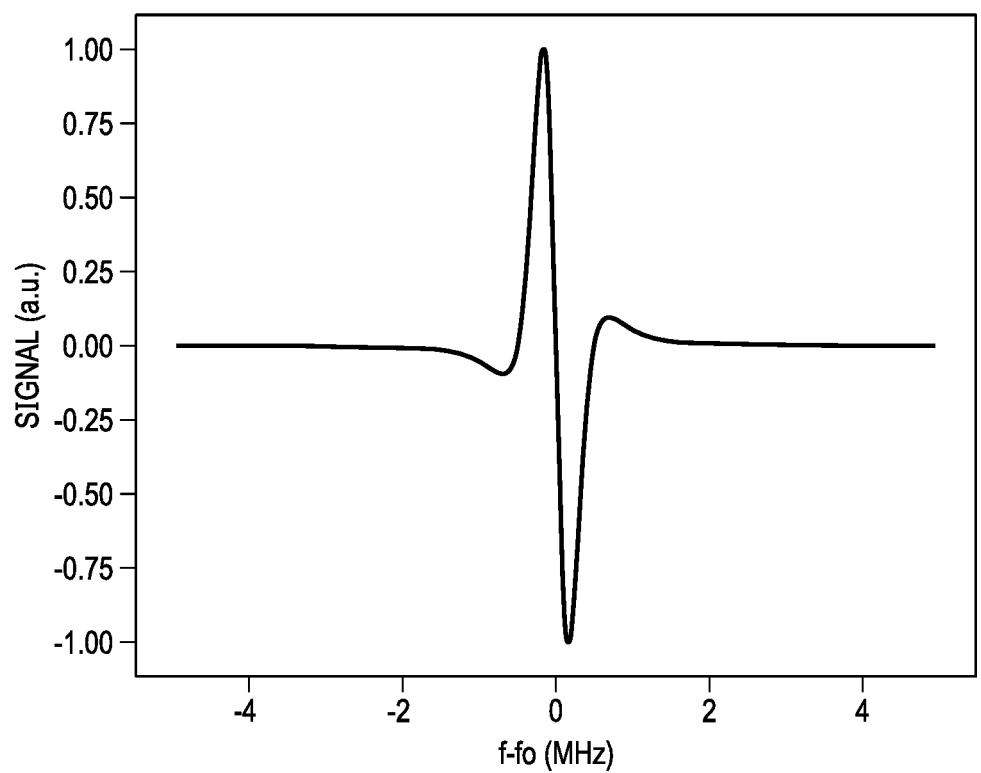
FIG. 10 shows an example of a third derivative of an amplitude signal generated for an absorption peak in accordance with this description.

FIG. 10 shows an example of a third derivative of the amplified LNA output signal 142. In the third derivative, the transition from positive peak to negative peak crosses the frequency axis at a minima of the absorption peak represented by the amplified LNA output signal 142. Some implementations of the reference oscillator control circuitry 302 adjust the frequency of the reference oscillator 108 so that the output 144 is at the frequency where the transition from positive peak to negative peak crosses the frequency axis.

The power control circuitry 304 includes circuitry to control the output power of the power amplifier 112 based on the second derivative of the amplified LNA output signal 142 (see FIG. 9). If the temperature of the mmwCSAC 100 is stable, then the amplitude of the peak of the second derivative is proportional to the power input to the cavity 102. The power control circuitry 304 applies the peak amplitude of the second derivative to stabilize the power of the electromagnetic field in the cavity 102 by controlling the output power of the power amplifier 112.

Various implementations of the mmwCSAC 100 may use analog or digital circuits to implement that functionality described herein. For example, in an implementation of the mmwCSAC 100, the control signal 126, the control signal 128, and the control signal 146 may analog signals that control analog circuitry of the reference oscillator 108, the PLL 110, and the power amplifier 112 respectively. The multiplier 118, the multiplier 120, and the multiplier 122 may be analog multipliers. The mixing signal generation circuitry 308 may include analog circuits to generate the mixer signal 132, the mixer signal 136, and the mixer signal 140 as analog signals. The ramp generator circuitry 306 may include analog circuitry to generate the ramp of control signal 128. The power control circuitry 304 may include analog circuitry to generate the control signal 146 based on the second derivative of the amplified LNA output signal 142, and the reference oscillator control circuitry 302 may include analog circuitry to generate the control signal 126 based on the first, second, and/or third derivative of the amplified LNA output signal 142.

Figure 11:
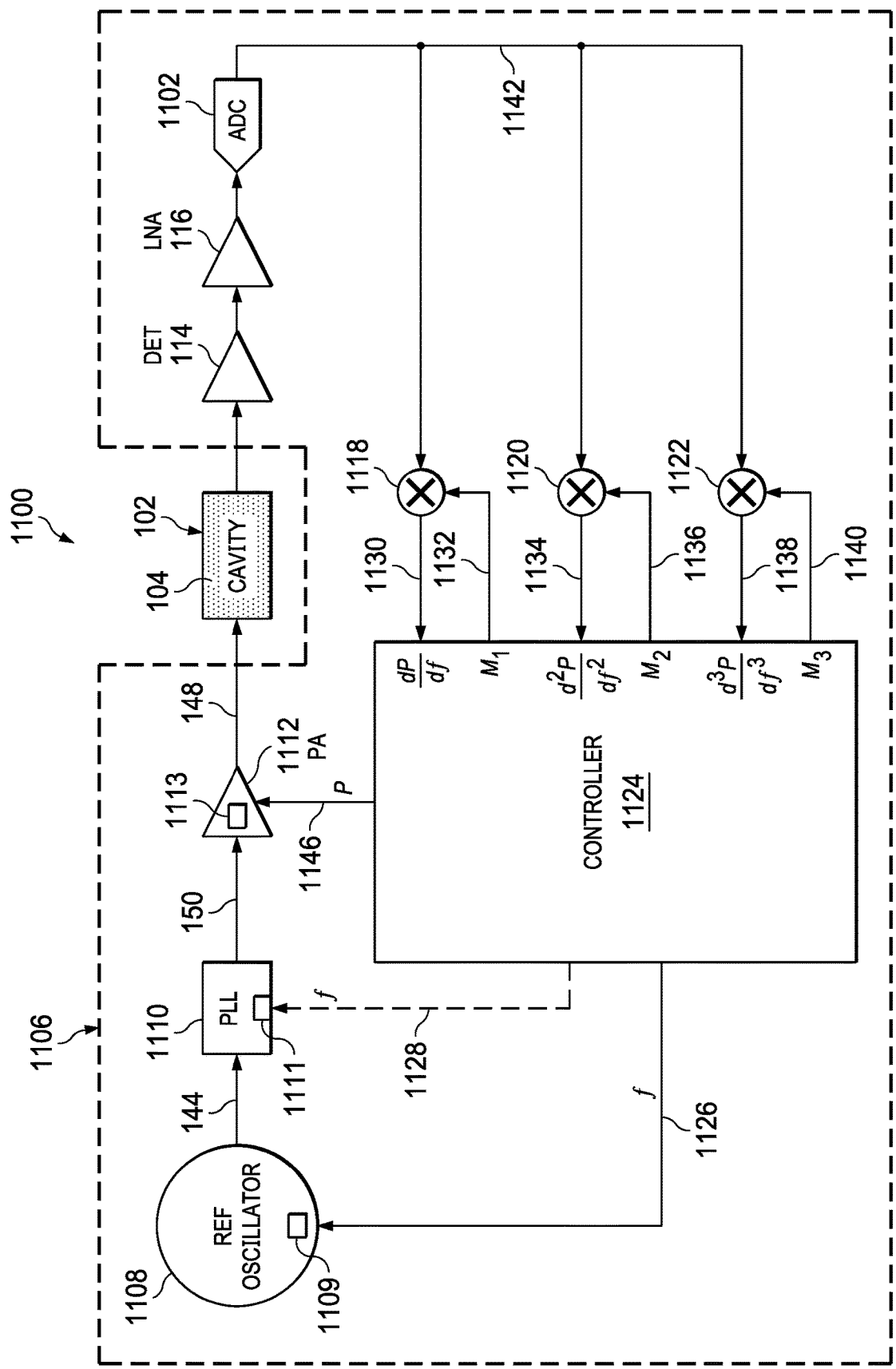
FIG. 11 shows a block diagram for an example of an mmwCSAC in accordance with this description.

FIG. 11 shows an example of an mmwCSAC 1100 in accordance with this description. The MMWCSAC 1100 is an example of the mmwCSAC 100, and implements various functions using digital circuitry. The MMWCSAC 1100 includes the cavity 102 that contains the dipolar molecule 104, and clock generation circuitry 1106 that interrogates the dipolar molecule 104.

The clock generation circuitry 1106 includes circuitry that drives electromagnetic signal into the cavity 102, receives electromagnetic signal from the cavity 102, and generates an oscillator signal locked to an absorption peak of the dipolar molecule 104 disposed in the cavity 102. More specifically, the clock generation circuitry 1106 includes a reference oscillator 1108, a PLL 1110, a power amplifier 1112, a detector circuit 114, an LNA 116, an analog-to-digital converter (ADC) 1102, a multiplier 1118, a multiplier 1120, a multiplier 1122, and a controller 1124.

The reference oscillator 1108 is an oscillator that is adjustable via the control signal 1126. The control signal 1126 is a digital signal. The reference oscillator 1108 may be a digitally-controlled crystal oscillator (DCXO) or a digitally-controlled temperature compensated crystal oscillator (DCTCXO). The reference oscillator 1108 includes a digital-to-analog converter (DAC) 1109 to convert the control signal 1126 to an analog signal for controlling the output frequency of the reference oscillator 1108. For example, the reference oscillator 1108 may include a crystal oscillator having an output frequency that can be varied over a narrow range by changing the control signal 1126. The output 144 of the reference oscillator 1108 is provided to the PLL 1110. The output 144 of the reference oscillator 1108 may also be provided to a driver circuit (not shown) for provision to circuits external to the MMWCSAC 1100.

The PLL 1110 is coupled to the reference oscillator 1108, and includes circuits to multiply the frequency of the output 144 up to a range that includes the frequency of the selected absorption peak of the dipolar molecule 104. The PLL 1110 may include a phase detector, a filter, counters, and other circuitry for PLL frequency multiplication. The output frequency of the PLL 1110 can be varied by the control signal 1128. The control signal 1128 is a digital signal. The PLL 1110 includes a DAC 1111 that converts the control signal 1128 to an analog signal for use in changing the output frequency of the PLL 1110. The output frequency of the PLL 1110 may be centered at a fixed multiple of the frequency of the output 144 and varied over a range that includes frequencies below and above the center frequency by changing the control signal 1128. In this way, the PLL 1110 may generate a frequency sweep about the absorption peak of the dipolar molecule 104. The output 150 of the PLL 1110 is a drive signal that is provided to the power amplifier 1112.

The power amplifier 1112 is coupled to the PLL 1110 and the cavity 102, and includes circuitry for amplifying the output 150 and driving the cavity 102. The power amplifier 1112 may include circuitry for applying voltage gain and/or current gain to the output 150. The output power of the power amplifier 112 is variable via the control signal 1146. The control signal 1146 is a digital signal. The power amplifier 1112 includes a DAC 1113 that converts the control signal 1146 to an analog signal for controlling the output power of the power amplifier 1112.

The cavity 102 includes an input port and an output port. The electromagnetic signal generated by the power amplifier 1112 propagates through the cavity 102 from the input port to the output port. The dipolar molecule 104 has an absorption peak at a frequency of quantum rotational state transition that reduces the amplitude of the electromagnetic signal at the output port at the absorption peak. The cavity 102 is coupled to the output port of the detector circuit 114.

The detector circuit 114 includes circuitry that monitors the amplitude of the electromagnetic signal at frequencies about the absorption peak. An implementation of the detector circuit 114 includes a mixer that multiplies the signal output from the cavity 102 and the output 150 output by the PLL 1110, and a low-pass filter that generates a signal from the output of the mixer, where the signal is representative of the amplitude of the signal received from the cavity 102 at the frequency generated by the PLL 1110. The output of the detector circuit 114 is provided to the LNA 116.

The LNA 116 amplifies the signal received from the detector circuit 114, and provides the amplified LNA output signal 142 to the ADC 1102. The ADC 1102 is coupled to the LNA 116, and digitizes the output of the LNA 116 to produce a digitized LNA output signal 1142. The multiplier 1118, the multiplier 1120, and the multiplier 1122 are digital circuits, and are coupled to the ADC 1102. The ADC 1102 provides the digitized LNA output signal 1142 to the multiplier 1118, the multiplier 1120, and the multiplier 1122. The mixer signal mixer signal 1132, the mixer signal mixer signal 1136, and the mixer signal 1140 are digital signals produced by the controller 1124. The multiplier 1118 multiples the digitized LNA output signal 1142 by the mixer signal 1132. The average of the product of the digitized LNA output signal 1142 and the mixer signal 1132 is the first derivative first derivative signal 1130 of the digitized LNA output signal 1142. The multiplier 1120 multiples the digitized LNA output signal 1142 by the mixer signal mixer signal 1136. The average of the product of the digitized LNA output signal 1142 and the mixer signal 1136 is the second derivative second derivative signal 1134 of the digitized LNA output signal 1142. The multiplier 1122 multiples the digitized LNA output signal 1142 by a mixer signal mixer signal 1140. The average of the product of the digitized LNA output signal 1142 and the mixer signal 1140 is the third derivative third derivative signal 1138 of the digitized LNA output signal 1142. The first derivative signal 1130, the second derivative signal 1134, and the third derivative signal 1138 are digital signals.

The multiplier 1118, the multiplier 1120, and the multiplier 1122 are coupled to the controller 1124. In some implementations of the MMWCSAC 1100, the multiplier 1118, the multiplier 1120, and the multiplier 1122 are included in the controller 1124. In some implementations, one or more of the multiplier 1118, the multiplier 1120, and the multiplier 1122 may be implemented as a common multiplier circuit. The controller 1124 provides the mixer signal 1132, the mixer signal 1136, and the mixer signal 1140 to the multiplier 1118, the multiplier 1120, and the multiplier 122 respectively. The controller 1124 receives the first derivative signal 1130 generated by the multiplier 1118, the second derivative signal 1134 generated by the multiplier 1120, and the third derivative signal 1138 generated by the multiplier 1122. The controller 1124 applies the first derivative signal 1130, the second derivative signal 1134, and the third derivative signal 1138 to generate the control signal 1126, the control signal 1128, and the control signal 1146 to respectively control the reference oscillator 1108, the PLL 1110, and the power amplifier 1112.

FIG. 12 shows a block diagram for an example of the controller 1124 in accordance with this description. The controller 1124 includes reference oscillator control circuitry 1202, power control circuitry 1204, ramp generator circuitry 1206, and mixing signal generation circuitry 1208. The reference oscillator control circuitry 1202, the power control circuitry 1204, the ramp generator circuitry 1206, and the mixing signal generation circuitry 1208 include digital circuits to generate digital control signals including the control signal 1126, the control signal 1128, and the control signal 1146. The ramp generator circuitry 1206 includes digital circuits that generate the control signal 1128 that modulates the output 150 generated by the PLL 1110. The control signal 1128 may be a sawtooth ramp, a triangular ramp, or a sinusoidal ramp. The ramp generator circuitry 1206 may include a memory that stores the digitized values of a ramp waveform and circuitry that reads the values from memory to generate the control signal 1128.

The mixing signal generation circuitry 1208 generates the mixer signal 1132, the mixer signal 1136, and the mixer signal 1140. The mixing signal generation circuitry 1208 may generate the mixer signal 1132, the mixer signal 1136, and mixer signal 1140 based on the control signal 1128. For example, the mixing signal generation circuitry 1208 may generate the transitions of the mixer signal 1132, the mixer signal 1136, and mixer signal 1140 based on addressing or clocking applied to generate the control signal 1128.

The reference oscillator control circuitry 1202 and the power control circuitry 1204 apply the first derivative signal 1130, the second derivative signal 1134, and/or the third derivative signal 1138 to generate the control signal 1126 for controlling the reference oscillator 1108 and to generate the control signal 1146 for controlling the power amplifier 1112. Implementations of the reference oscillator control circuitry 1202 include circuitry to adjust the frequency of the reference oscillator 1108 based on the first derivative signal 1130, the second derivative signal 1134, and/or the third derivative signal 1138. For example, the control signal 1126 generated by the reference oscillator control circuitry 1202 is a digital value that specifies an output frequency change in the reference oscillator 1108. Some implementations of the reference oscillator control circuitry 1202 adjust the frequency of the reference oscillator 1108 so that the frequency of the output 144 corresponds to the frequency where the first derivative crosses the frequency axis as shown in FIG. 8. Some implementations of the reference oscillator control circuitry 1202 adjust the frequency of the reference oscillator 1108 so that the frequency of the output 144 corresponds the peak of the second derivative as shown in FIG. 9. Some implementations of the reference oscillator control circuitry 1202 adjust the frequency of the reference oscillator 1108 so that the frequency of the output 144 corresponds to the point where the transition from positive peak to negative peak crosses the frequency axis as shown in FIG. 11.

The power control circuitry 1204 includes circuitry to generate the control signal 1146 for controlling the output power of the power amplifier 1112 based on the second derivative of the digitized LNA output signal 1142 (see FIG. 9). Implementations of the power control circuitry 1204 apply the peak of the amplitude of the second derivative to stabilize the power of the electromagnetic field in the cavity 102 by controlling the output power of the power amplifier 1112.

Some implementations of the mmwCSAC 100 may combine analog and digital circuitry to provide the functionality described herein. For example, the ramp generation may be digital, and the reference oscillator control or the power amplifier control may be analog.

FIG. 13 shows a flow diagram for an example of a method 1300 for generating a clock signal in an mmwCSAC in accordance with this description. Though depicted sequentially as a matter of convenience, at least some of the actions shown can be performed in a different order and/or performed in parallel. Additionally, some implementations may perform only some of the actions shown. Operations of the method 1300 may be performed by an implementation of the mmwCSAC 100.

In block 1302, the controller 124 generates a ramp to modulate the frequency of the output 150 generated by the PLL 110. The ramp may be a sawtooth ramp, a triangular ramp, or a sinusoidal ramp. The ramp is provided to the PLL 110 as the control signal 128.

In block 1304, the control signal 128 causes the PLL 110 to sweep the frequency of a signal driven into the cavity 102 over a range about the absorption peak of the dipolar molecule 104. For example, the PLL 110 may sweep the frequency of the output 150 over a range 204 as shown in FIG. 2.

In block 1306, the frequency sweep generated by the PLL 110 is transmitted into the cavity 102 by the power amplifier 112.

In block 1308, the detector circuit 114 detects electromagnetic signal at an output port of the cavity 102. The signal detected corresponds to the signal transmitted into the cavity with amplitude attenuation at the absorption peak of the dipolar molecule 104.

In block 1310, the detector circuit 114 generates an output signal that corresponds to the power of the signal detected at the output port of the cavity 102.

In block 1312, an output signal generated by the detector circuit 114 is provided to one or more multipliers. The multipliers mix the detector output signal with one or more mixer signals to produce derivatives of the detector output signal. For example, the multiplier 118 multiples the amplified LNA output signal 142 by a mixer signal 132 to produce the first derivative 130 of the amplified LNA output signal 142, the multiplier 120 multiples the amplified LNA output signal 142 by a mixer signal 136 to produce the second derivative 134 of the amplified LNA output signal 142, and the multiplier 122 multiples the amplified LNA output signal 142 by a mixer signal 140 to produce the third derivative 138 of the amplified LNA output signal 142.

In block 1314, the controller 124 applies the first derivative 130, the second derivative 134, and/or the third derivative 138 to set the output frequency of the reference oscillator 108. For example, the controller 124 may set the output frequency of the reference oscillator 108 based on a peak frequency of the second derivative 134, and/or on zero crossing frequency of the first derivative 130 and/or the third derivative 138.

In block 1316, the controller 124 applies the second derivative 134 to set the output power of the power amplifier 112. For example, the controller 124 may set the output power of the power amplifier 112 based on the peak amplitude of the second derivative 134.

Modifications are possible in the described embodiments, and other embodiments are possible, within the scope of the claims.

What is claimed is:

1. A clock generator, comprising:
  a cavity containing a dipolar molecule having an absorption peak at a first frequency; and
  clock generation circuitry coupled to the cavity, the clock generation circuitry including:
    a reference oscillator;
    a detector circuit coupled to the cavity;
    a multiplier configured to:
      receive a signal that is based on a detection signal from the detector circuit, wherein the detection signal is representative of an amplitude of an output signal from the cavity over a continuous range of frequencies including the first frequency; and
      multiply the received signal with a mixing signal to produce a derivative, of the received signal, which indicates the absorption peak; and
    control circuitry coupled between the reference oscillator and the multiplier.

2. The clock generator of claim 1, wherein:
  the multiplier is a first multiplier, the mixing signal is a first mixing signal, and the derivative is a first derivative; and
  the clock generation circuitry further includes a second multiplier coupled to the control circuitry, wherein the second multiplier is configured to receive the signal and multiply the received signal with a second mixing signal to produce a second derivative, of the received signal, which indicates the absorption peak.

3. The clock generator of claim 2, wherein the clock generation circuitry further includes a third multiplier coupled to the control circuitry, wherein the third multiplier is configured to receive the signal and multiply the received signal with a third mixing signal to produce a third derivative, of the received signal, which indicates the absorption peak.

4. The clock generator of claim 1, wherein the control circuitry is configured to control a frequency of the reference oscillator based on the derivative of the received signal.

5. The clock generator of claim 4, wherein the clock generation circuitry further includes a phase-locked-loop (PLL) coupled to the reference oscillator and the control circuitry, and the control circuitry is configured to control the PLL to generate, for providing to the cavity and based on the frequency of the reference oscillator, a drive signal over the continuous range of frequencies that includes the first frequency.

6. The clock generator of claim 1, wherein the clock generation circuitry further includes a power amplifier coupled to the cavity and the control circuitry, wherein the control circuitry is configured to control output power of the power amplifier based on the derivative.

7. The clock generator of claim 1, wherein the clock generation circuitry further includes a low-noise amplifier coupled between the detector circuit and the multiplier.

8. The clock generator of claim 1, wherein the clock generation circuitry further includes:
  a low-noise amplifier coupled to the detector circuit; and
  an analog-to-digital converter coupled between the low-noise amplifier and the multiplier.

9. A method for clock generation, comprising:
  receiving a signal from a cavity that contains a dipolar molecule, wherein the signal is a drive signal attenuated by an absorption peak, of the dipolar molecule, at a first frequency;
  generating a power signal representative of an amplitude of the signal from the cavity over a continuous range of frequencies including the first frequency;
  multiplying the power signal with a mixing signal to produce a derivative of the power signal which indicates the absorption peak; and
  setting a frequency of a reference oscillator based on the derivative of the power signal.

10. The method of claim 9, wherein the mixing signal is a first mixing signal, and the derivative is a first derivative; and the method further comprises:
  multiplying the power signal with a second mixing signal to produce a second derivative of the power signal which indicates the absorption peak;
  setting the frequency of the reference oscillator based on the second derivative of the power signal; and
  setting output power of a power amplifier that provides the drive signal to the cavity, wherein setting the output power is based on the second derivative of the power signal.

11. The method of claim 10, further comprising:
  multiplying the power signal with a third mixing signal to produce a third derivative of the power signal which indicates the absorption peak; and
  setting the frequency of the reference oscillator based on the third derivative of the power signal.

12. The method of claim 9, further comprising generating a ramp signal to modulate a frequency of the drive signal over the continuous range of frequencies.

13. The method of claim 12, further comprising providing the ramp signal to a control input of a phase-locked-loop to modulate the frequency of the drive signal.

14. The method of claim 12, further comprising providing the ramp signal to a control input of the reference oscillator to modulate the frequency of the drive signal.

15. The method of claim 9, wherein multiplying the power signal with the mixing signal includes:
digitizing the power signal; and
digitally multiplying the digitized power signal with the mixing signal.

16. A clock generator, comprising:
a cavity containing a dipolar molecule having an absorption peak at a first frequency; and
clock generation circuitry coupled to the cavity, the clock generation circuitry including:
a reference oscillator;
a phase-locked-loop (PLL) coupled to the reference oscillator;
a detector circuit coupled to the cavity;
a multiplier configured to:
receive a signal that is based on a detection signal from the detector circuit, wherein the detection signal is representative of an amplitude of an output signal from the cavity over a continuous range of frequencies including the first frequency; and
multiply the received signal with a mixing signal to produce a derivative, of the received signal, which indicates the absorption peak; and
control circuitry coupled to the multiplier, the reference oscillator and the PLL,
wherein the control circuitry is configured to:
control a frequency of the reference oscillator based on the derivative of the received signal; and
control the PLL to generate, for providing to the cavity and based on the frequency of the reference oscillator, a drive signal over the continuous range of frequencies that includes the first frequency.

17. The clock generator of claim 16, wherein:
the multiplier is a first multiplier, the mixing signal is a first mixing signal, and the derivative is a first derivative;
the clock generation circuitry further includes:
a power amplifier coupled to the PLL, the cavity, and the control circuitry; and
a second multiplier coupled to the control circuitry, wherein the second multiplier is configured to receive the signal and multiply the signal with a second mixing signal to produce a second derivative, of the received signal, which indicates the absorption peak; and
the control circuitry is configured to:
control output power of the power amplifier based on the second derivative; and
control the frequency of the reference oscillator based on the second derivative.

18. The clock generator of claim 17, wherein:
the clock generation circuitry further includes a third multiplier coupled to the control circuitry, wherein the third multiplier is configured to receive the signal and multiply the received signal with a third mixing signal to produce a third derivative, of the received signal, which indicates the absorption peak; and
the control circuitry is configured to control the frequency of the reference oscillator based on the third derivative.

19. A system comprising:
waveguide input signal generation circuitry including a reference oscillator having an oscillator control input;
waveguide output signal detection circuitry including a detector circuit;
a multiplier having first and second multiplier inputs and having a multiplier output, the first multiplier input is coupled to the waveguide output signal detection circuitry; and
control circuitry including:
an oscillator control circuit having: a respective input coupled to the multiplier output; and an oscillator control output coupled to the oscillator control input;
a ramp generator coupled to the waveguide input signal generation circuitry; and
a mixing signal generator having a respective output coupled to the second multiplier input.

20. The system of claim 19, further comprising a waveguide coupled between the waveguide input signal generation circuitry and the waveguide output signal detection circuitry, the waveguide including a cavity containing a dipolar molecule.

21. The system of claim 19, wherein the ramp generator is coupled to the reference oscillator.

22. The system of claim 19, wherein:
the reference oscillator has an oscillator output; and
the waveguide input signal generation circuitry further includes a phase-locked loop (PLL) having a PLL input coupled to the oscillator output.

23. The system of claim 22, wherein the PLL input is a first PLL input, and the PLL has a second PLL input coupled to the ramp generator.

24. The system of clam 22, wherein the multiplier is a first multiplier and the multiplier output is a first multiplier output, and the system further comprises a second multiplier having third and fourth multiplier inputs and a second multiplier output, and wherein:
the detector circuit includes a detector circuit output;
the waveguide output signal detection circuitry further includes a first amplifier having: a first amplifier input coupled to the detector output; and an amplifier output coupled to the first and third multiplier inputs;
the PLL has a PLL output;
the waveguide input signal generation circuitry further includes a second amplifier having a second amplifier input coupled to the PLL output and an amplifier control input;
the output of the mixing signal generator is a first mixing signal generator output, the mixing signal generator having a second mixing signal generator output coupled to the fourth multiplier input; and
the control circuitry further includes amplifier control circuitry having a respective input coupled to the second multiplier output and an amplifier control output coupled to the amplifier control input.

25. The system of claim 19, wherein:
the waveguide output signal detection circuitry further includes an analog-to-digital converter (ADC) having an ADC output coupled to the first multiplier input; and
the reference oscillator includes a digital-to-analog converter.

26. A system comprising:
a reference oscillator having an oscillator control input and an oscillator output;
a phase-locked loop (PLL) having a PLL input coupled to the oscillator output and having a PLL output;
a first amplifier having a first amplifier input coupled to the PLL output;
a detector circuit having a detector output;

a second amplifier having a second amplifier input coupled to the detector output and having an amplifier output;

a multiplier having first and second multiplier inputs and having a multiplier output, the first multiplier input is coupled to the amplifier output of the second amplifier; and control circuitry including:
 an oscillator control circuit having: a respective input coupled to the multiplier output; and an oscillator control output coupled to the oscillator control input;
 a ramp generator coupled to the reference oscillator or the PLL; and
 a mixing signal generator having a respective output coupled to the second multiplier input.

27. The system of claim 26, further comprising a cavity containing a dipolar molecule, the cavity is coupled between the first amplifier and the detector circuit.

28. The system of clam 26, wherein the multiplier is a first multiplier and the multiplier output is a first multiplier output, and the system further comprises a second multiplier having third and fourth multiplier inputs and a second multiplier output, the third multiplier input is coupled to the amplifier output of the second amplifier, wherein:
 the output of the mixing signal generator is a first mixing signal generator output, the mixing signal generator having a second mixing signal generator output coupled to the fourth multiplier input;
 the first amplifier has an amplifier control input; and
 the control circuitry further includes amplifier control circuitry having a respective input coupled to the second multiplier output and an amplifier control output coupled to the amplifier control input.

29. The system of claim 28, further comprising a third multiplier having fifth and sixth multiplier inputs and a third multiplier output, wherein:
 the fifth multiplier input is coupled to the amplifier output of the second amplifier;
 the input of the oscillator control circuit is a respective first input, the oscillator control circuit having a respective second input coupled to the third multiplier output; and
 the mixing signal generator has a third mixing signal generator output coupled to the sixth multiplier input.

30. The system of claim 26, further comprising an analog-to-digital converter (ADC) coupling the amplifier output of the second amplifier to the first multiplier input, wherein:
 the reference oscillator includes a first digital-to-analog converter (DAC);
 the PLL includes a second DAC; and
 the first amplifier includes a third DAC.

\* \* \* \* \*